US009082928B2

(12) United States Patent  (10) Patent No.: US 9,082,928 B2
Ashkenazi  (45) Date of Patent: Jul. 14, 2015

(54) NEXT GENERATION THERMOELECTRIC DEVICE DESIGNS AND METHODS OF USING SAME

(76) Inventor: Brian Isaac Ashkenazi, Los Angeles, CA (US)

( * ) Notice: Subject to any disclaimer, the term of this patent is extended or adjusted under 35 U.S.C. 154(b) by 452 days.

(21) Appl. No.: 13/303,059

(22) Filed: Nov. 22, 2011

(65) Prior Publication Data
US 2012/0145210 A1 Jun. 14, 2012

Related U.S. Application Data

(60) Provisional application No. 61/459,275, filed on Dec. 9, 2010.

(51) Int. Cl.
H01L 35/32 (2006.01)
(52) U.S. Cl.
CPC ...................... H01L 35/32 (2013.01)
(58) Field of Classification Search
CPC .......... H01L 35/04; H01L 35/32; H01L 35/34
USPC .......................................... 136/200
See application file for complete search history.

(56) References Cited

U.S. PATENT DOCUMENTS

| 3,248,777 | A | * | 5/1966 | Stoll | 136/201 |
|---|---|---|---|---|---|
| 5,448,109 | A | | 9/1995 | Cauchy | |
| 5,563,368 | A | | 10/1996 | Yamaguchi | |
| 5,824,947 | A | | 10/1998 | Macris | |
| 5,966,939 | A | | 10/1999 | Tauchi | |
| 6,005,182 | A | | 12/1999 | Imanishi | |
| 6,020,671 | A | | 2/2000 | Pento | |
| 6,034,317 | A | | 3/2000 | Watanabe | |
| 6,034,318 | A | | 3/2000 | Lycke | |
| 6,226,994 | B1 | | 5/2001 | Yamada | |
| 6,252,154 | B1 | | 6/2001 | Kamada | |
| 6,274,803 | B1 | | 8/2001 | Yoshioka | |
| 6,314,741 | B1 | | 11/2001 | Hiraishi | |
| 6,329,217 | B1 | | 12/2001 | Watanabe | |
| 6,400,013 | B1 | | 6/2002 | Tsuzaki | |
| 6,410,840 | B1 | | 6/2002 | Sudo | |
| 6,441,295 | B2 | | 8/2002 | Hiraishi | |
| 6,441,296 | B2 | | 8/2002 | Hiraishi | |
| 6,444,893 | B1 | | 9/2002 | Onoue | |
| 6,477,844 | B2 | | 11/2002 | Ohkubo | |
| 6,492,585 | B1 | | 12/2002 | Zamboni | |
| 6,548,750 | B1 | | 4/2003 | Picone | |
| 6,660,925 | B1 | | 12/2003 | Sharp | |
| 6,894,215 | B2 | | 5/2005 | Akiba | |
| 7,278,199 | B2 | | 10/2007 | Tateyama | |
| 7,299,639 | B2 | | 11/2007 | Leija | |
| 7,312,392 | B2 | | 12/2007 | Yotsuhashi | |
| 7,317,159 | B2 | | 1/2008 | Adachi | |
| 7,436,059 | B1 | | 10/2008 | Ouyang | |
| 7,446,256 | B2 | | 11/2008 | Kanno | |
| 7,619,158 | B2 | | 11/2009 | Sharp | |
| 7,629,531 | B2 | | 12/2009 | Stark | |
| 7,723,606 | B2 | | 5/2010 | Fiorini | |

(Continued)

Primary Examiner — James Lin
Assistant Examiner — Dujuan Horton

(57) ABSTRACT

This patent incorporates several new modified irregular-shaped thermoelectric element designs and connections for use in thermoelectric conversion devices to increase efficiency and lower the cost and size of thermoelectric devices. Thermoelectric conversion devices using the new design criteria have demonstrated comparative higher performance than current commercially available standard thermoelectric conversion devices.

5 Claims, 14 Drawing Sheets

(56) References Cited

U.S. PATENT DOCUMENTS

| | | |
|---|---|---|
| 7,777,126 B2 | 8/2010 | Chu |
| 7,820,905 B2 | 10/2010 | Ito |
| 7,868,242 B2 | 1/2011 | Takahashi |
| 7,871,847 B2 | 1/2011 | Moczygemba |
| 7,942,010 B2 | 5/2011 | Bell |
| 7,956,277 B2 | 6/2011 | Kuchimachi |
| 7,982,278 B2 | 7/2011 | Tokunaga |
| 7,994,415 B2 | 8/2011 | Kanno |
| 7,999,172 B2 | 8/2011 | Yu |
| 8,035,026 B2 | 10/2011 | Tajima |
| 2004/0155251 A1* | 8/2004 | Abramov et al. ............... 257/81 |
| 2008/0236643 A1* | 10/2008 | Li ................................. 136/203 |
| 2010/0170551 A1 | 7/2010 | Hiroyama |
| 2010/0252086 A1 | 10/2010 | Fujie |
| 2010/0282286 A1 | 11/2010 | Kanno |
| 2010/0326487 A1 | 12/2010 | Komori |
| 2011/0000517 A1 | 1/2011 | Park |
| 2011/0036384 A1 | 2/2011 | Culp |
| 2011/0088737 A1 | 4/2011 | Nakamura |
| 2011/0094556 A1 | 4/2011 | Stark |
| 2011/0247668 A1 | 10/2011 | Bell |
| 2011/0265839 A1 | 11/2011 | Hiroyama |
| 2011/0284523 A1 | 11/2011 | Hiroyama |
| 2011/0298080 A1 | 12/2011 | Hiroyama |
| 2011/0315182 A1 | 12/2011 | Tajima |
| 2012/0000500 A1 | 1/2012 | Iida |
| 2012/0017963 A1 | 1/2012 | Stefan |

* cited by examiner

Top View

NEXT GENERATION THERMOELECTRIC DEVICE DESIGNS AND METHODS OF USING SAME

CROSS-REFERENCE TO RELATED APPLICATION

This application claims priority of U.S. Provisional Patent Application No. 61/459,275, entitled "Next Generation Thermoelectric Devices" filed Dec. 9, 2010.

BACKGROUND

Summary

Design of a thermoelectric conversion device, for power generation or cooling, of the present invention includes irregular shaped n-type and p-type thermoelectric elements. New design criteria for modified shapes and connections of thermoelectric elements are presented.

BRIEF DESCRIPTION OF THE DRAWINGS

The features, aspects, and advantages of the designs of this invention will become more thoroughly apparent from the following detailed description, appended claims, and accompanying drawings in which the side views of typical n-type/p-type thermoelectric element pairs used in thermoelectric devices comparison testing that was performed; typical heating and cooling (alumina) plates are mostly not depicted:

DETAILED DESCRIPTION

The conversion efficiency of heat to useful energy is an on-going challenge for the energy industry. Current commercially available thermoelectric conversion devices, for cooling and power generation, are fabricated from regular-shaped (rectangular, cube, cylindrical, etc.) thermoelectric elements and produce relatively low efficiency heat conversion when compared to other renewable energy conversion technologies such as photovoltaic and wind power.

Thermoelectric conversion devices have made incremental gains in device efficiency over the past decade mainly due to continued development of many new expensive thermoelectric materials with higher ZT (a thermoelectric figure of merit). Utilizing the new expensive materials no doubt yields slightly better efficiency for the thermoelectric devices but cost makes them prohibitive for commercial use, and they are not yet efficiently competitive to other renewable energy conversion technologies, such as photovoltaic.

Other types of thermoelectric conversion devices include other fabrication techniques including vapor deposition, thin-film, design/lay out on an electronic material wafer, segmented design, nanomaterials, nanotube devices, etc., that also incrementally help in surmounting the thermoelectric efficiency barrier; however, the fabrication costs to produce them still remain prohibitively high.

The basic premise of the workings of a thermoelectric device is that the temperature gradient/difference from hot side of a thermoelectric element pair (1) to the cold side of element pair (2) determines the voltage across the device and hence the efficiency. Therefore, tremendous effort continues to be expended in the development of heat sink/cooling assemblies that rapidly remove the heat expended from the cold side of the element as well as new thermoelectric materials that provide more favorable thermoelectric output properties.

Figure 1:
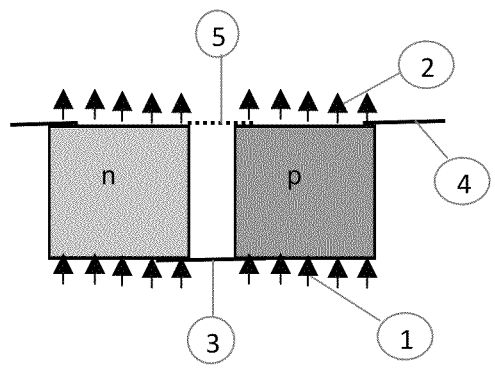
FIG. 1 is a side view of n-type/p-type thermoelectric elements that illustrates the layout of thermoelectric elements in current typical commercially available thermoelectric conversion devices.

Commercially available conventional thermoelectric conversion devices require an n-type thermoelectric element as well as a p-type thermoelectric element, both fabricated from standard relatively inexpensive bulk materials, which are interconnected. FIG. 1 provides the general layout of a typical commercially available thermoelectric device. N-type and p-type Bismuth Telluride [$(Bi\,Sb)_2Te_3$] thermoelectric elements, mostly rectangular in shape, i.e., the cross-sectional area is constant along the vertical axis or path of heat flow, are sandwiched between two high thermal conductivity alumina substrates. With alternating bottom interconnects (3) and top interconnects (4), the n-type and p-type elements are connected sequentially in series. For the drawings of this patent, the heat flow is from the bottom to the top, making all thermoelectric elements thermally in parallel. In cooling mode, an externally applied current forces the heat to flow from the bottom to the top. In power generation mode, heat flowing from the bottom to the top drives a current through an external load.

This patent incorporates new thermoelectric element designs and interconnections that empower the element to self-regulate and improve the temperature gradient of each thermoelectric element, enhance circuit performance of the thermoelectric element pairs and ultimately contribute to the optimal output efficiency of the thermoelectric conversion device.

Figure 2:
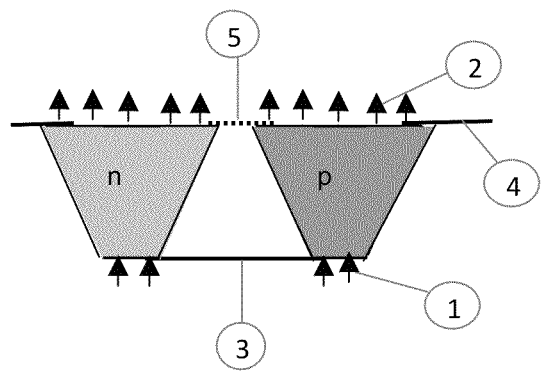
FIG. 2 illustrates the basic low-to-high area concept for a thermoelectric conversion device.

Low-Area Heat Input to High-Area Heat Output:

This design requires the heat output surface area, in contact with cooling plate/source, of each element to be greater than the heat input surface area, in contact with the heating plate/source, of each element (FIG. 2). Thus, since the Element $Area_{Cool}$>Element $Area_{Hot}$ during normal operating conditions, the temperature at the cool end of the element is lowered, the heat flow in the element is better controlled and temperature gradient regulation is performed by the internal workings of the thermoelectric elements. Accordingly, since the exit temperature for the modified thermoelectric element is lowered as compared to that of a conventional/rectangular thermoelectric element, this results in the following:

greater temperature gradient for the modified thermoelectric element/device increase in conversion efficiency for modified thermoelectric element/device lowering the requirement for external removal of heat, and the electricity required to perform comparative cooling is also lowered.

Figure 3:
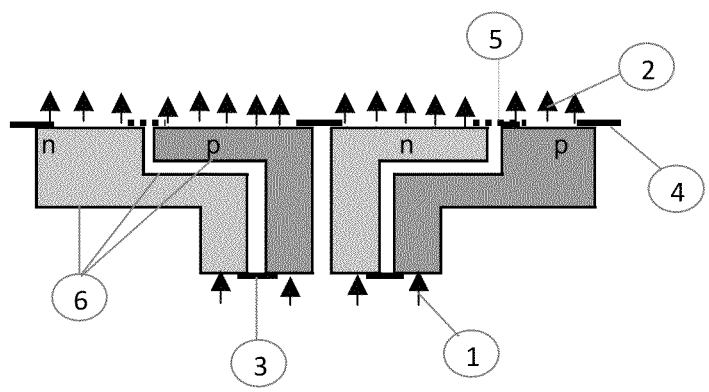
FIG. 3 illustrates a thermoelectric device with both elements having the basic low-to-high area concept and double change of heat flow direction design for a thermoelectric conversion device.
Figure 4:
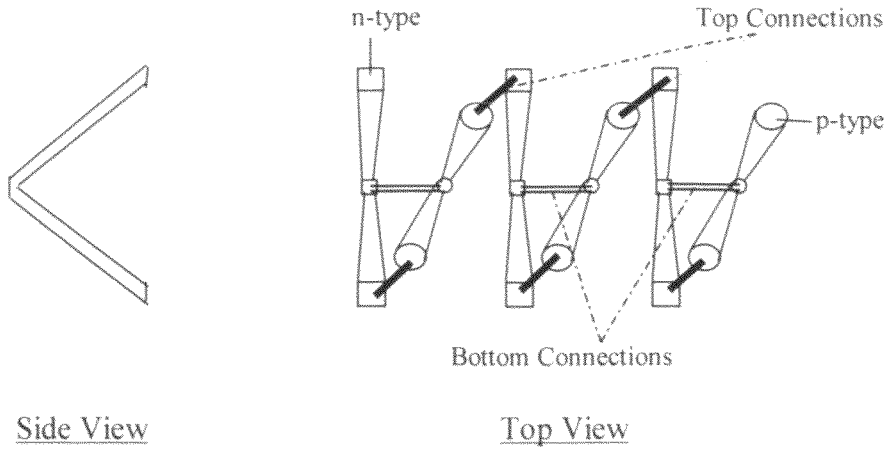
FIG. 4 illustrates an external thermoelectric reinforcing circuit design using U and/or V shaped elements for a thermoelectric conversion device.
Figure 5:
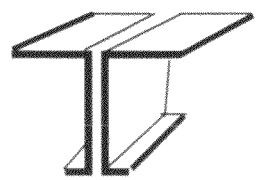
FIG. 5 illustrates a design of low-to-high area elements design with a single change in heat flow direction incorporated for a thermoelectric device.
Figure 6:
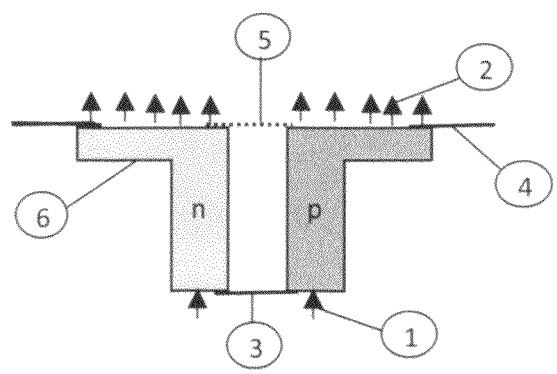
FIG. 6 illustrates a pair of thermoelectric elements including a simple low-to-high area design and incorporating an external thermoelectric reinforcing circuit for a thermoelectric conversion device.
Figure 7:
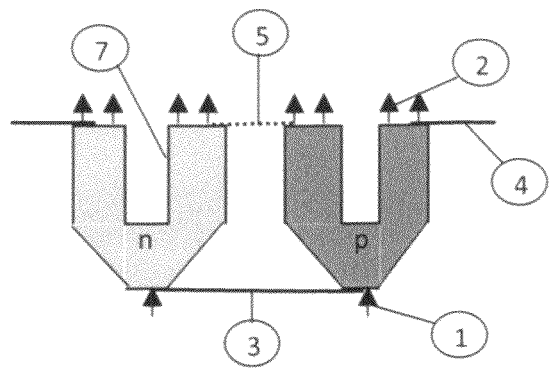
FIG. 7 illustrates a pair of thermoelectric elements including a simple low-to-high area design and incorporates an open cut out at center top to integrate an external thermoelectric reinforcing circuit for a thermoelectric conversion device.
Figure 8:
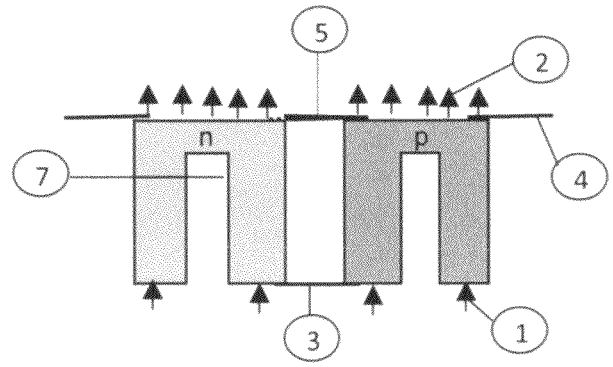
FIG. 8 illustrates a pair of thermoelectric elements including a simple low-to-high area design and incorporates an open cut out at center bottom for a thermoelectric device.
Figure 9:
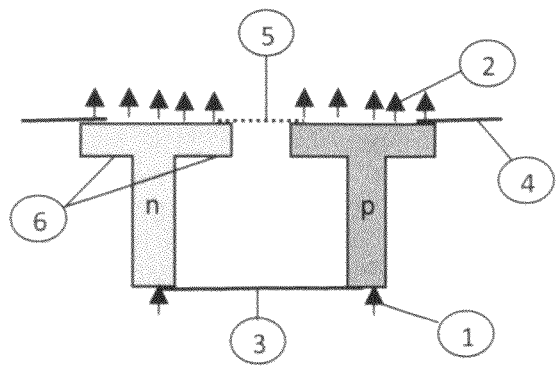
FIG. 9 illustrates a pair of T-shaped thermoelectric elements including a low-to-high area design and incorporating a single change of heat flow direction with an external thermoelectric reinforcing circuit for a thermoelectric conversion device.
Figure 10A:
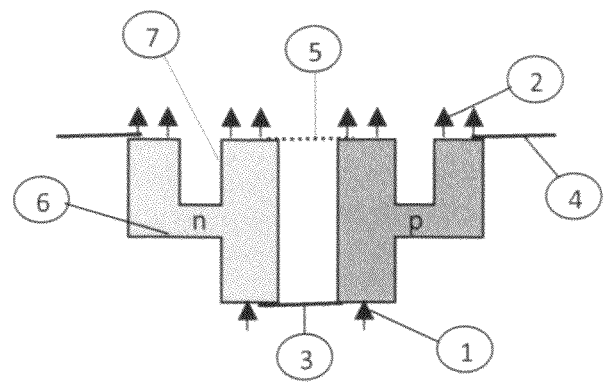
FIGS. 10a-10c illustrate a pair of thermoelectric elements including a simple low-to-high area design, incorporating a cut-out to integrate an external thermoelectric reinforcing circuit, a double change of heat flow direction and different positions for the heat input "leg" on the elements for a thermoelectric device.
Figure 10B:
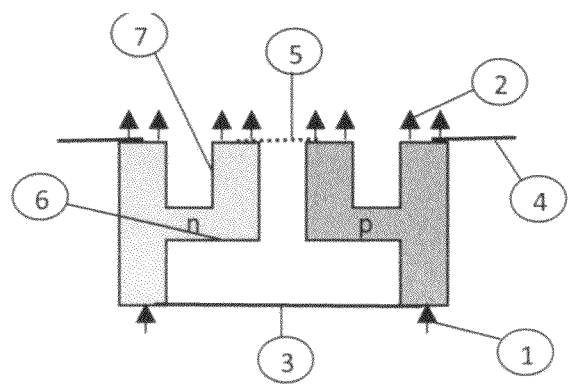
Figure 10C:
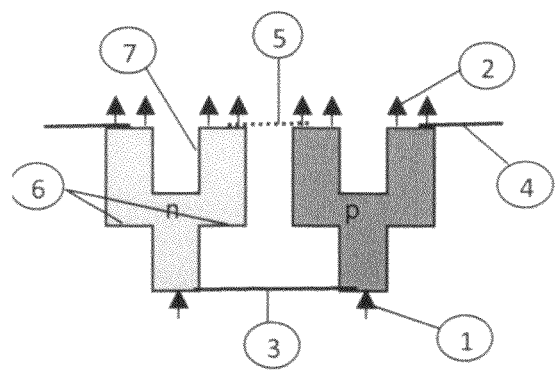
Figure 11A:
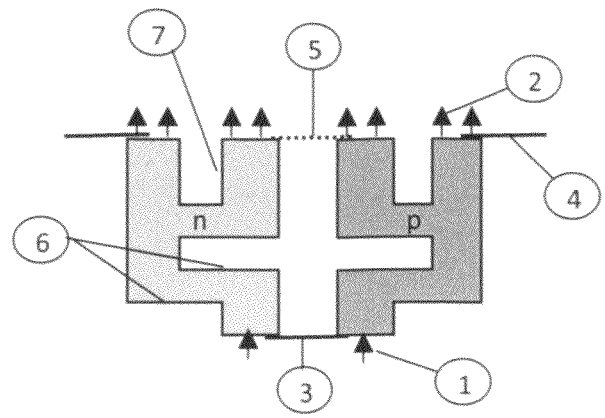
FIGS. 11a-11b illustrate a pair of thermoelectric elements where each element includes a low-to-high area design, one horizontal cut-out to offer three changes in heat flow direction, a vertical cut-out at top to integrate an external thermoelectric reinforcing circuit, and separate horizontal cutout(s) at bottom of element to offer different positions for the heat input "leg" on the elements for a thermoelectric conversion device.
Figure 11B:
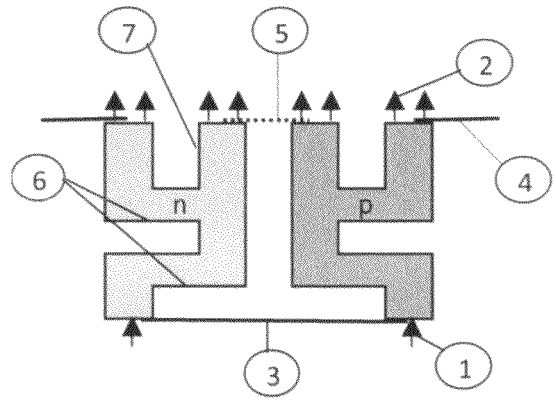
Figure 12A:
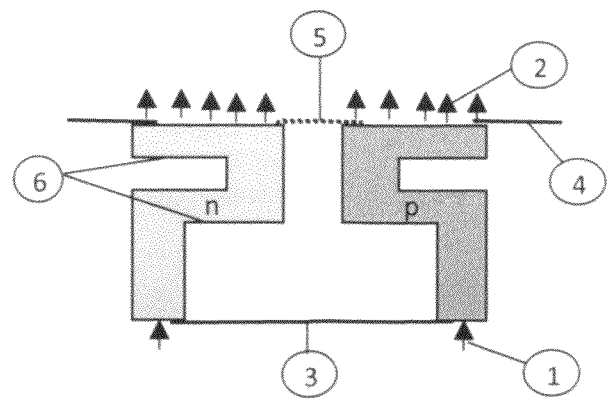
FIGS. 12a-12b illustrate a pair of thermoelectric elements where each element includes a simple low-to-high area design, two horizontal cutouts to offer three changes in heat flow direction, an external thermoelectric reinforcing circuit, and different positions for the heat input "leg" on the elements for a thermoelectric conversion device.
Figure 12B:
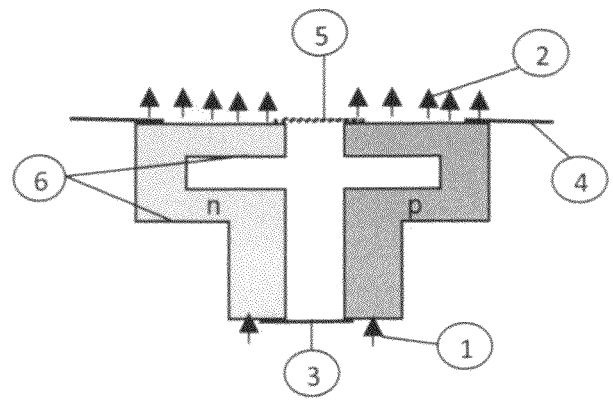
Figure 13A:
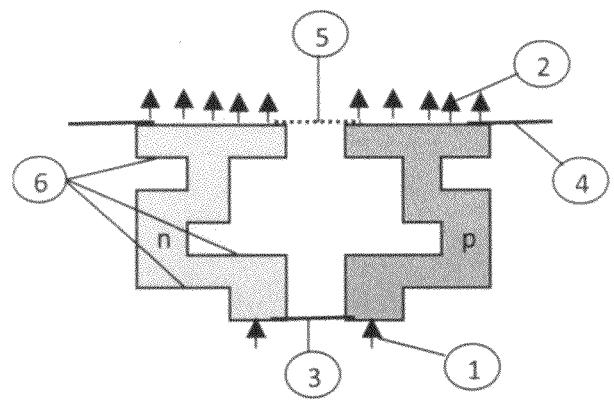
FIGS. 13a-13c illustrate a pair of thermoelectric elements where each element includes a simple low-to-high area design, three horizontal cutouts to offer five changes in heat flow direction, an external thermoelectric reinforcing circuit, and different positions for the heat input "leg" on the elements for a thermoelectric conversion device.
Figure 13B:
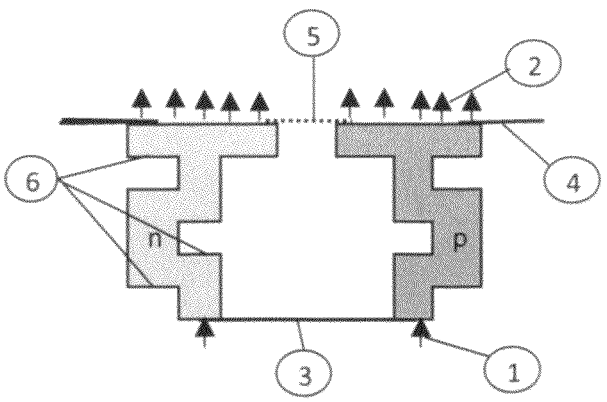
Figure 13C:
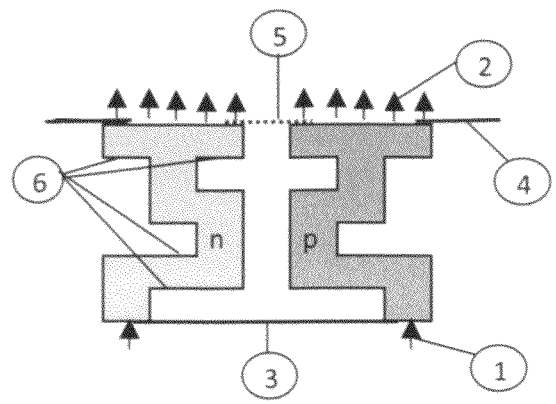
Figure 14A:
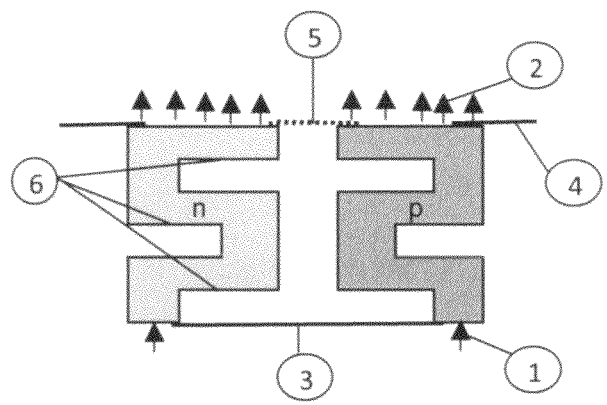
FIGS. 14a-14c illustrate a pair of thermoelectric elements, each element includes a simple low-to-high area design, incorporating three deeper horizontal cutouts to offer five changes in heat flow direction, an external thermoelectric reinforcing circuit, and different positions for the heat input "leg" on the elements for a thermoelectric conversion device.
Figure 14B:
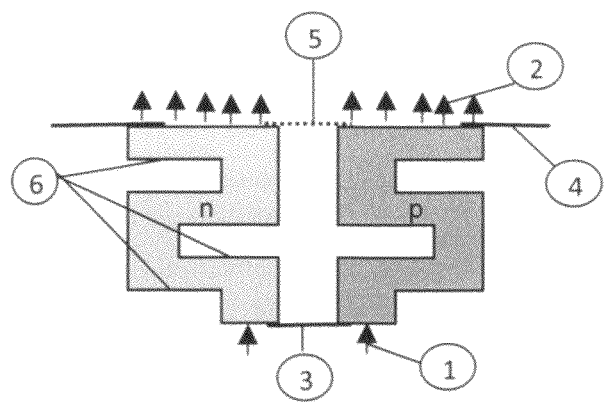
Figure 14C:
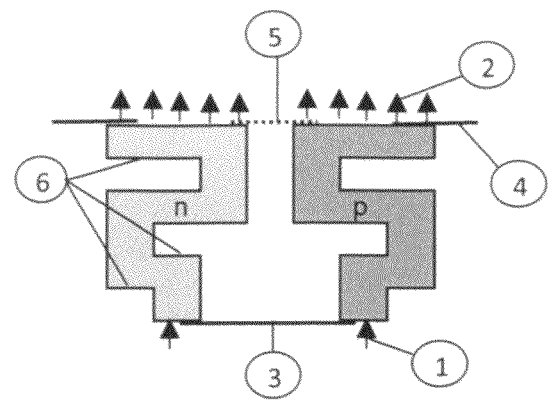
Figure 15A:
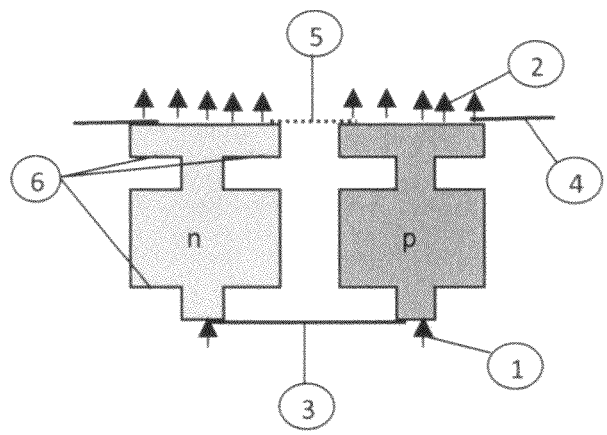
FIGS. 15a-15d illustrate a pair of faucet-shaped thermoelectric elements to enhance and integrate an external thermoelectric reinforcing circuit with cutouts/holes at center to provide additional changes in heat flow direction and different positions for the heat input "leg" on the elements for a thermoelectric conversion device.
Figure 15B:
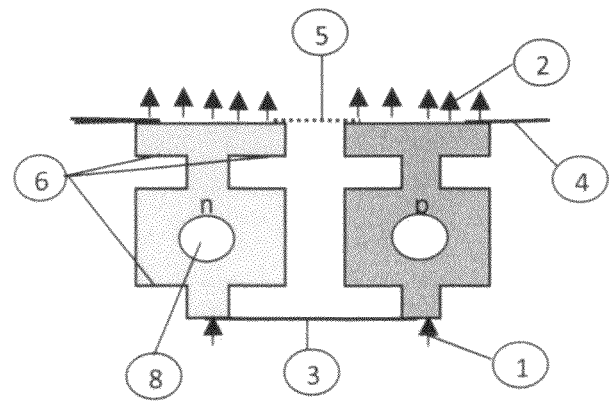
Figure 15C:
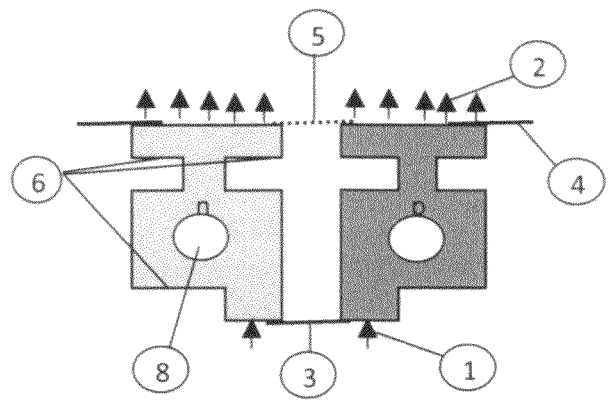
Figure 15D:
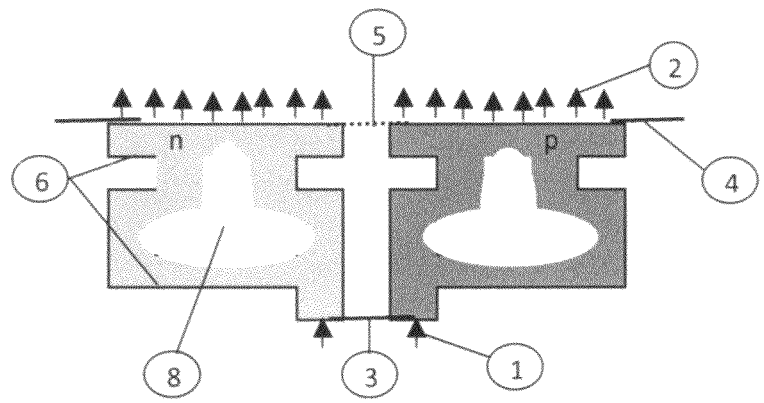
Figure 16:
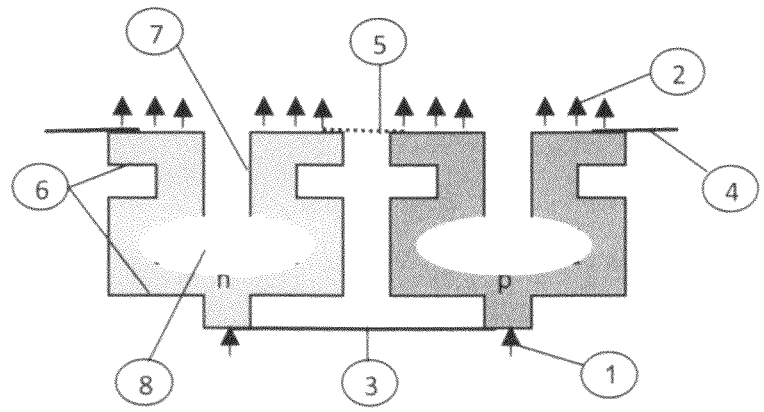
FIG. 16 illustrates a pair of thermoelectric elements that incorporate low-to-high area design, multiple changes of heat flow direction and an open cutout at top to optimize workings of the external thermoelectric reinforcing circuit for a thermoelectric conversion device.

Changes in Heat Flow Direction(s):

This design treats the action of heat flowing through the thermoelectric elements as if it were fluid. The proposed modified designs channel the heat in varying directions while flowing through the element (FIG. 3). The changes in heat flow directions are created by making horizontal cutouts (6) and/or vertical cutouts (7), made at any angle, and/or central holes (8) in the standard rectangular thermoelectric elements.

Figure 17A:
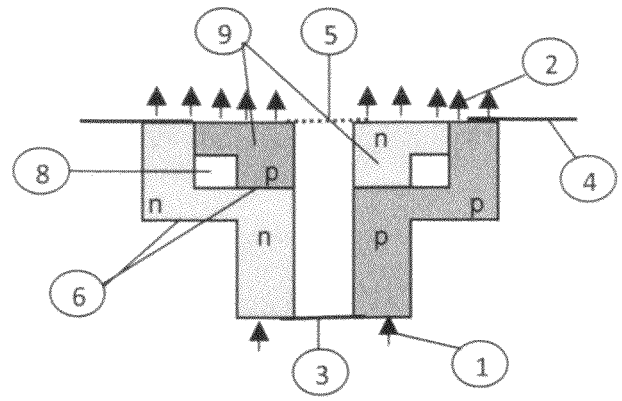
FIGS. 17a-17d illustrate a pair of thermoelectric elements where each element includes low-to-high area design, multiple changes of heat flow direction, an internal composite thermoelectric reinforcing circuit, as well as an external thermoelectric reinforcing circuit for a thermoelectric conversion device.
Figure 17B:
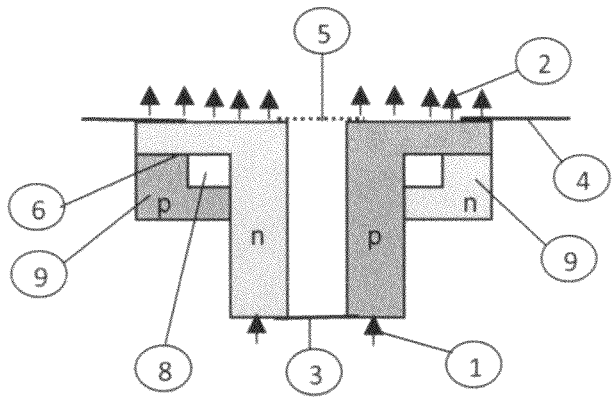
Figure 17C:
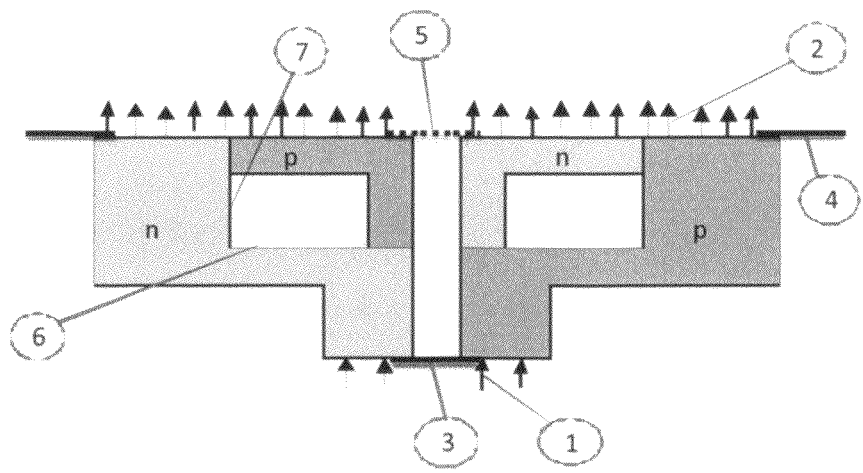
Figure 17D:
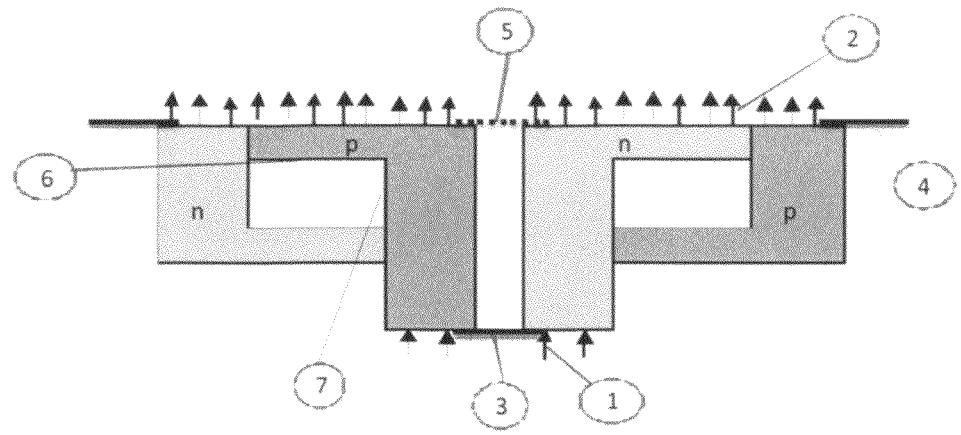
Figure 17E:
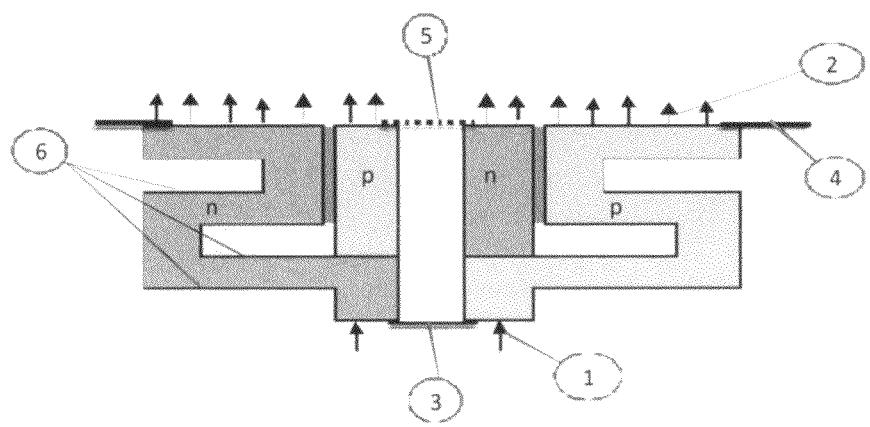
FIGS. 17e-17f illustrate a pair of thermoelectric elements where each element includes low-to-high area design, multiple changes of heat flow direction, conjoined composite thermoelectric element design, as well as an external thermoelectric reinforcing circuit for a thermoelectric conversion device.
Figure 17F:
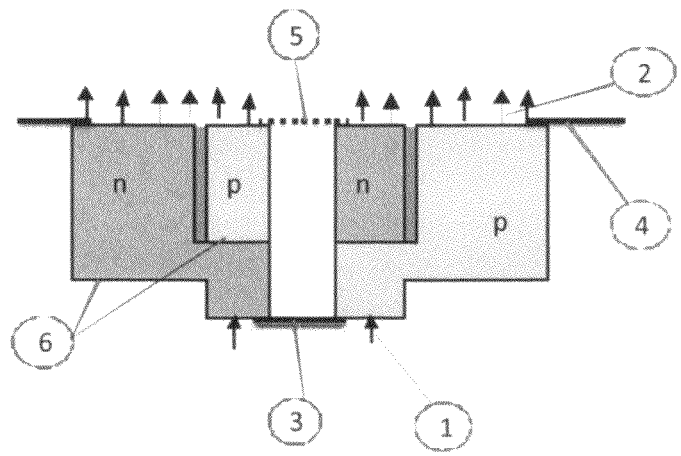
Figure 17G:
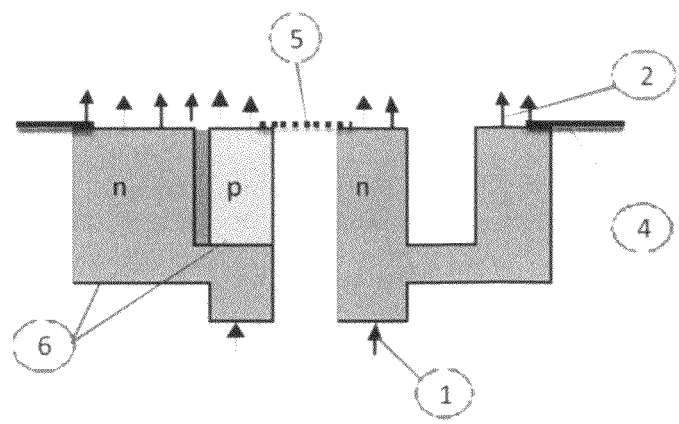
FIG. 17g illustrates a pair of thermoelectric elements where one element includes a n-type/p-type conjoined composite thermoelectric design and the other n-type element includes low-to-high area design and multiple changes of heat flow direction.
Figure 18:
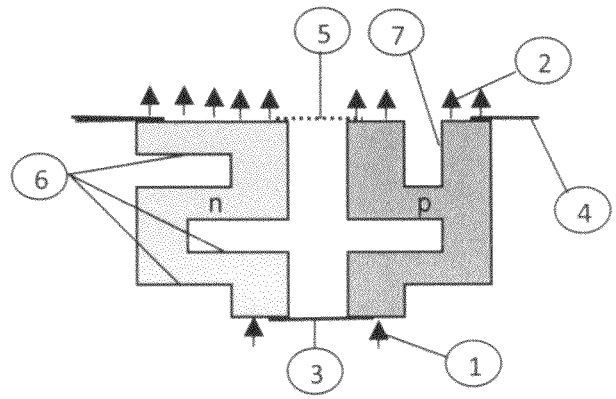
FIG. 18 illustrates a pair of thermoelectric elements where each thermoelectric element in the pair of elements includes a different set of design criteria for a thermoelectric conversion device.
Figure 19:
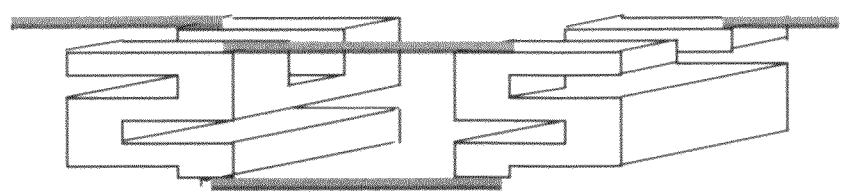
FIG. 19 illustrates a pair of thermoelectric elements where each thermoelectric element includes a vertical cutout at the heat output surface of the element to enhance the effectiveness of an external thermoelectric reinforcing circuit for a thermoelectric conversion device.

An additional design to assist in channeling heat flowing through the element is a conjoined composite thermoelectric element. This design includes a multi-directional thermoelectric element of, say n-type material, designed with an additional "branch" of paired, say p-type, element attached close to the base/heat input area of the main element part (FIGS. 17e-17g). Introduction of thermal and/or electrical insulation between the branch and the multi-directional main element part could be beneficial to improving performance of the conjoined composite thermoelectric element. This element design performs best when used as a conjoined element pair (FIGS. 17e-17f) or with a change in n-type and p-type alternating element array (FIG. 17g), both of the aforementioned used with an optional external reinforcing circuit (Para 0044).

The changes in heat flow direction effectively better excite and activate electrical activity across the entire cross-sectional area of all points internal to the thermoelectric element that would normally remain relatively dormant. Multiple changes in heat flow directions in each thermoelectric element have demonstrated better results. Also, this criterion will produce more compact designs of thermoelectric conversion devices.

Fabrication of the modified thermoelectric elements can be accomplished by extruding the raw element material to net shape, including as many of the described criteria into the extruded shape, and slice/dice the extrusion to the desired thickness.

Figure 20:
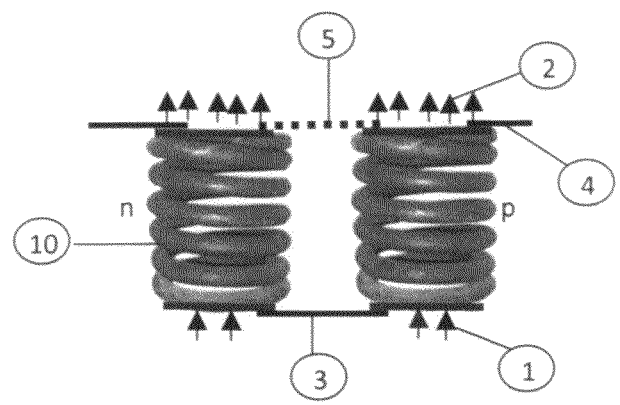
FIG. 20 illustrates a pair of thermoelectric spring-like elements where each thermoelectric element is in the shape of a helical spring
Figure 21:
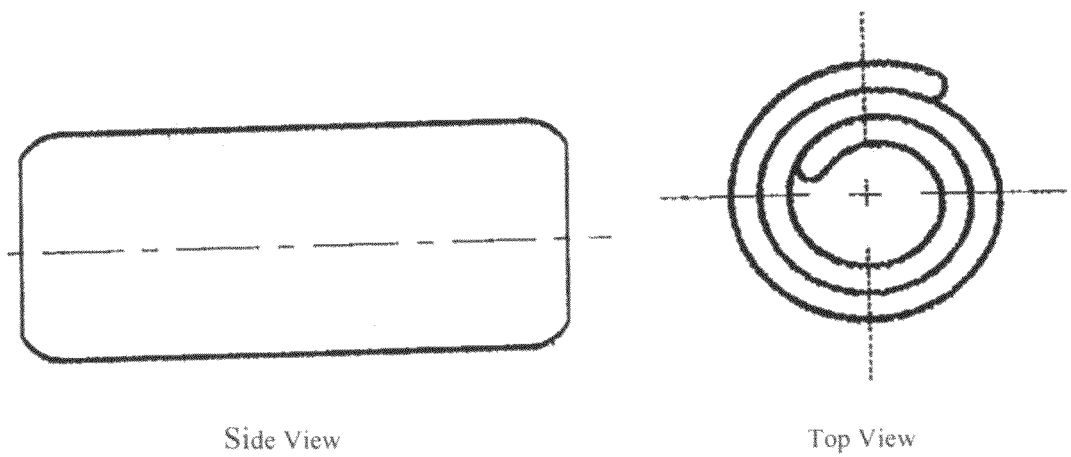
FIG. 21 illustrates a thermoelectric element in the shape of a rolled/coiled spring pin.
Figure 22:
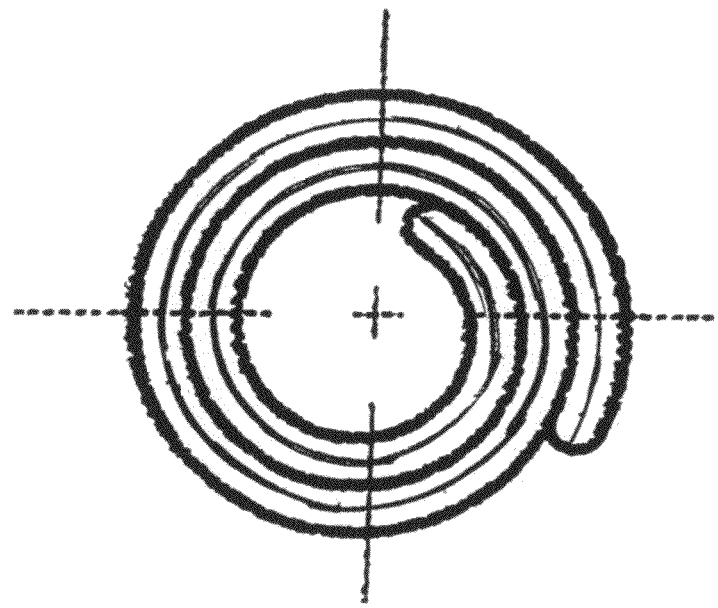
FIG. 22 illustrates a top view of a thermoelectric element pair in the combined shape of a helical spring and rolled/coiled spring pin.

The use of a helical spring element design (10) provides infinite, continuous changes in the heat flow direction. Each such thermoelectric (n-type or p-type) element can be made in a helical coiled spring form (FIG. 20) or a thermoelectric element can be fabricated like a coiled/rolled spring pin by rolling an insulator sheet between the layers of an n-type or p-type sheet (FIG. 21). The ideal design for such a spring-like thermoelectric element pair includes a combination of helical spring and a coiled/rolled spring pin whereby insulator tapes are rolled between the layers of n-type and p-type thermoelectric element tapes to form a helical spring shaped thermoelectric element pair (FIG. 22). In addition, a core material placed at center of the spring-like thermoelectric elements or element pairs will provide further enhancement to the temperature gradient and overall efficiency of the thermoelectric element pairs.

In addition, a simple helical shaped hollow container, single or double barreled and made from plastic or other insulator material will also suffice; the container(s) is/are filled with thermoelectric fluid and capped at both ends with conductive closures to complete the thermoelectric elements or element pairs ready for use in a thermoelectric device. The spring-like thermoelectric elements/pairs will yield a more efficient and more compact thermoelectric conversion device.

Thermoelectric Reinforcing Circuits:

The designs of two unique thermoelectric reinforcing circuits, internal change of layout for thermoelectric elements and external interconnection for thermoelectric element pairs, are presented in this patent. Both designs intensify the inner workings of the thermoelectric element to significantly increase the output efficiency of thermoelectric conversion devices.

The internal thermoelectric reinforcing circuit (9) includes one or more extra loop(s) of say n-type material that is/are connected to the p-type material element, and vice versa, to create a composite element; the loop (FIGS. 17a-17b) may be attached with thermally-electrically conductive adhesive or by other means. The thermoelectric reinforcing loop/circuit enhances the performance of the composite thermoelectric element.

The external thermoelectric reinforcing circuit (5) includes an additional connection made between the elements of a thermoelectric element pair, i.e., if the standard connection between the elements of a thermoelectric element pair is at the bottom, as described in Para. 0032, the additional external thermoelectric reinforcing circuit connection is made at the top of and between the same thermoelectric element pair. For best results, the external thermoelectric reinforcing circuit connection can be alternated at top as described above, thus repeated for each thermoelectric element pair in the thermoelectric device circuit.

When used internally, externally or combined, each thermoelectric reinforcing circuit provides the following multifunctional benefits for the thermoelectric element/element pair:

it increases the temperature gradient between hot and cool ends of each thermoelectric element to magnify the heat conversion efficiency it stabilizes the heat flow to create a temperature equilibrium between the n-type and p-type elements in the thermoelectric element pair by transferring heat from the hotter temperature surface to the cooler surface; this temperature equilibrium at one end of the thermoelectric element pair produces more responsive thermoelectric functionality between the excited/heated end and equilibrium/cooler ends within the thermoelectric elements which yields higher conversion efficiency the additional electrical circuit creates a thermoelectric cooling effect in conjunction with the power generation of the thermoelectric element pair; this further controls the heat flow through the thermoelectric element pairs, thus reducing the cooling requirement on the thermoelectric element pair and yields greater conversion efficiency.

it allows part of the electrical output from one thermoelectric element to be channeled back to the other thermoelectric element in the thermoelectric element pair that augments the electrical performance of both thermoelectric elements, thus producing better heat conversion efficiency for the thermoelectric element pair/device.

Comparative Testing Performed on New Thermoelectric Device Designs:

Testing was performed on thermoelectric element pairs including the various new designs presented above. Three batches of thermoelectric devices were fabricated; in each batch standard elements pairs were fabricated as a reference/comparative benchmark.

Figure 23:
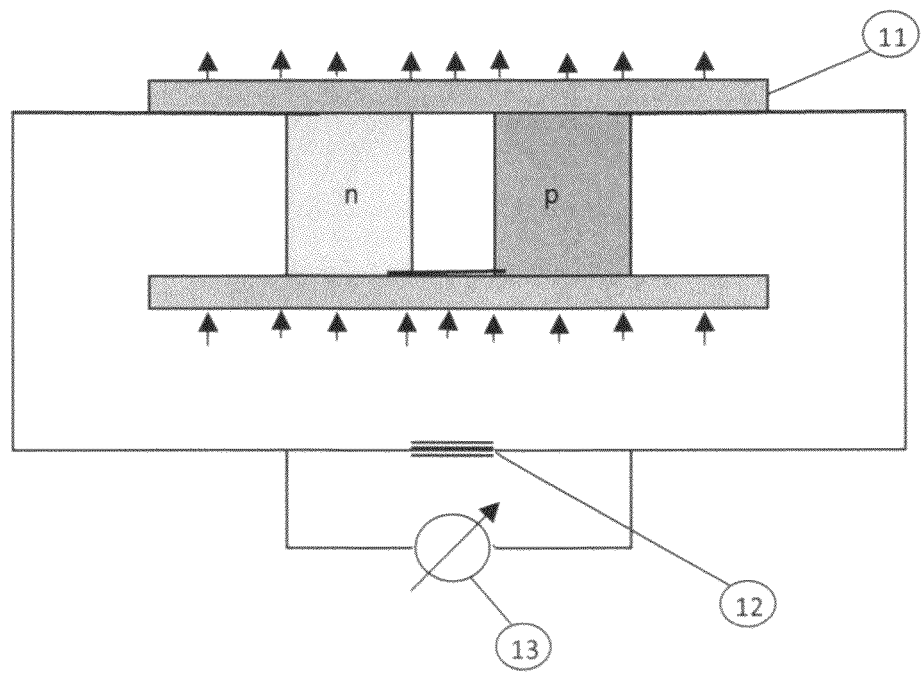
FIG. 23 illustrates the setup used for comparison testing the design criteria performance of the thermoelectric element pairs.

Per the design criteria discussed above the following work was performed:

several thermoelectric element shapes were machined to design requirements each pair of thermoelectric elements was sandwiched between alumina plates (11) and electrical connections were made between the thermoelectric elements specific to each thermoelectric element pair/device, as depicted in the drawings each thermoelectric device was placed on a test bench as depicted in FIG. 23 heat was applied to the bottom alumina plate (1) of the thermoelectric device heat removal/cooling was applied to the top alumina plate (2) of the thermoelectric device extreme care was taken at all times to isolate the heat application strictly to the bottom plate and the same for the cooling at the top plate.

For each test performed on the devices fabricated, the following test criteria were intentionally and strictly kept constant:

1) Electrical connections in device and circuitry
2) Temperature of heat input (1)
3) Heat removal/cooling (2)
4) Test circuit layout including resistor (12), wires and voltmeter (13)
5) Alumina plates—size, thickness, material type
6) N-type material—initial size and from same material batch
7) P-type material—initial size and from same material batch
8) Time of test heat up and measurement of results Testing: Heat was applied to one side of one test device at a time and heat removal/cooling applied to the other side of the device. The voltage readings were recorded at 5-10 minute intervals Test results for each of the three batches differed slightly; however, it was found that for each batch the results were comparably the same, i.e., the new thermoelectric elements/device designs produced results that were 20% to 45% higher than those of the standard thermoelectric device designs.

Additional test observations:

a few of the thermoelectric element design criteria discussed above achieved maximum or higher results much faster than the others increasing the rate of heat removal at the cool ends for a few of the new thermoelectric element design criteria did not produce a significant change in results, which leads directly to the premise that external cooling requirements are reduced for the new designs.

multiple thermoelectric element pair devices produced very similar test results limited testing of the thermoelectric devices in cooling demonstrated fair results.

It is anticipated that the proposed designs of this patent be utilized with all thermoelectric materials and fluids, element designs, element pairs connections, device shapes, layouts and arrays, fabrication processes, and methods of manufacture to produce the highest efficiency thermoelectric elements, thermoelectric element pairs and thermoelectric conversion devices for economical, high conversion efficiency and emission free power generation and cooling.

Many widely different examples of this invention may be made without departing from the spirit and scope thereof, and it is to be understood that the invention is not limited to the specific examples thereof except as defined in the appended claims.

The invention claimed is:

1. A thermoelectric devices for use in power generation or cooling modes comprising at least one thermoelectric element having one or more holes to modify, channel or direct the flow of heat or electric charges internal to the at least one thermoelectric element, wherein the at least one thermoelectric element includes a heat output area of the at least one thermoelectric element which is greater than a heat input area of the at least one thermoelectric element, or conversely a heat input area which is greater than a heat output area of the at least one thermoelectric element.

2. A thermoelectric devices for use in power generation or cooling modes comprising at least one pair of thermoelectric elements, the at least one pair of thermoelectric elements comprises an n-type thermoelectric element and a p-type thermoelectric element, wherein the n-type thermoelectric element and the p-type thermoelectric elements directly contact each other and form a hole between the n-type and p-type thermoelectric elements created by the relative shape and positioning of the n-type and p-type thermoelectric elements in the at least one pair of thermoelectric elements, and at least one of the n-type or p-type thermoelectric elements in the at least one pair of thermoelectric elements includes a heat output area which is greater than a heat input area, or conversely a heat input area which is greater than a heat output area.

3. The thermoelectric device of claim 2, wherein the n-type or p-type thermoelectric element in the at least one pair of thermoelectric elements makes direct contact with both the heat output area and the heat input area of the thermoelectric device and the other thermoelectric element in the at least one pair of thermoelectric elements makes direct dual contacts with only the n-type or p-type thermoelectric element in the at least one pair of thermoelectric elements.

4. The thermoelectric device of claim 2, wherein the n-type or p-type thermoelectric element in the at least one pair of thermoelectric elements makes direct contact with both the heat output area and heat input area of the thermoelectric device and the other thermoelectric element in the at least one pair of thermoelectric elements makes a direct contact with the n-type or p-type thermoelectric element in the at least one pair of thermoelectric elements and with the heat output area or heat input area of the thermoelectric device.

5. The thermoelectric device of claim 2, wherein a shape and design of the n-type or p-type thermoelectric element used in the at least one pair of thermoelectric elements in the thermoelectric device is different from a shape and design of respective n-type or p-type-thermoelectric element used in a second at least one pair of thermoelectric elements in the thermoelectric device.

* * * * *